United States Patent
Hao et al.

(10) Patent No.: US 11,984,296 B2
(45) Date of Patent: *May 14, 2024

(54) SUBSTRATE SUPPORT WITH IMPROVED PROCESS UNIFORMITY

(71) Applicant: Lam Research Corporation, Fremont, CA (US)

(72) Inventors: Fangli Hao, Cupertino, CA (US); Yuehong Fu, Fremont, CA (US); Zhigang Chen, Campbell, CA (US)

(73) Assignee: Lam Research Corporation, Fremont, CA (US)

( * ) Notice: Subject to any disclaimer, the term of this patent is extended or adjusted under 35 U.S.C. 154(b) by 448 days.

This patent is subject to a terminal disclaimer.

(21) Appl. No.: 17/151,366

(22) Filed: Jan. 18, 2021

(65) Prior Publication Data

US 2021/0166914 A1 Jun. 3, 2021

Related U.S. Application Data

(63) Continuation of application No. 15/399,244, filed on Jan. 5, 2017, now Pat. No. 10,910,195.

(51) Int. Cl.
*H01J 37/32* (2006.01)
*H01L 21/683* (2006.01)
*H01L 21/687* (2006.01)
*H01L 21/67* (2006.01)

(52) U.S. Cl.
CPC .... *H01J 37/32082* (2013.01); *H01L 21/6831* (2013.01); *H01L 21/68735* (2013.01); *H01L 21/68757* (2013.01); *H01L 21/67103* (2013.01); *H01L 21/67109* (2013.01)

(58) Field of Classification Search
CPC ........... H01L 21/32082; H01L 21/6831; H01L 21/68735; H01L 21/68757; H01L 21/67103; H01L 21/67109
See application file for complete search history.

(56) References Cited

U.S. PATENT DOCUMENTS

| | | |
|---|---|---|
| 3,752,956 A | 8/1973 | Cahill et al. |
| 4,416,561 A | 11/1983 | Fischer |
| 5,059,770 A | 10/1991 | Mahawili |
| 5,074,456 A | 12/1991 | Degner et al. |

(Continued)

FOREIGN PATENT DOCUMENTS

| | | |
|---|---|---|
| JP | 08293539 A | 11/1996 |
| JP | 2000049143 A | 2/2000 |

(Continued)

OTHER PUBLICATIONS

Notification of Transmittal of International Search Report and the Written Opinion of the International Searching Authority dated Feb. 14, 2018, 15 pages.

(Continued)

*Primary Examiner* — Charlee J. C. Bennett

(57) ABSTRACT

A substrate support for supporting a substrate in a substrate processing system includes a baseplate and a ceramic layer arranged above the baseplate. An outer perimeter of the ceramic layer is surrounded by an edge ring. An outer radius of the ceramic layer is greater than an inner radius of the edge ring such that an outer edge of the ceramic layer extends below the edge ring.

13 Claims, 6 Drawing Sheets

(56) References Cited

U.S. PATENT DOCUMENTS

| | | | |
|---|---|---|---|
| 5,359,148 A | 10/1994 | Okase et al. | |
| 5,376,213 A | 12/1994 | Ueda et al. | |
| 5,447,570 A | 9/1995 | Schmitz et al. | |
| 5,522,131 A | 6/1996 | Steger | |
| 5,583,736 A | 12/1996 | Anderson et al. | |
| 5,740,009 A * | 4/1998 | Pu | H01L 21/6833 361/234 |
| 5,745,331 A | 4/1998 | Shamouilian et al. | |
| 5,753,132 A | 5/1998 | Shamouilian et al. | |
| 5,781,400 A | 7/1998 | Takahashi et al. | |
| 5,886,863 A | 3/1999 | Nagasaki et al. | |
| 5,928,528 A | 7/1999 | Kubota et al. | |
| 5,944,902 A | 8/1999 | Redeker et al. | |
| 5,968,379 A | 10/1999 | Zhao et al. | |
| 5,968,587 A | 10/1999 | Frankel | |
| 5,978,202 A | 11/1999 | Wadensweiler et al. | |
| 6,035,101 A | 3/2000 | Sajoto et al. | |
| 6,048,798 A | 4/2000 | Gadgil et al. | |
| 6,073,577 A | 6/2000 | Lilleland et al. | |
| 6,108,189 A | 8/2000 | Weldon et al. | |
| 6,170,432 B1 | 1/2001 | Szapucki et al. | |
| 6,189,483 B1 | 2/2001 | Ishikawa et al. | |
| 6,194,322 B1 | 2/2001 | Lilleland et al. | |
| 6,228,438 B1 | 5/2001 | Schmitt | |
| 6,228,439 B1 | 5/2001 | Watanabe et al. | |
| 6,306,247 B1 | 10/2001 | Lin | |
| 6,310,755 B1 | 10/2001 | Kholodenko et al. | |
| 6,376,385 B2 | 4/2002 | Lilleland et al. | |
| 6,395,363 B1 | 5/2002 | Ballance et al. | |
| 6,452,775 B1 | 9/2002 | Nakajima | |
| 6,462,928 B1 | 10/2002 | Shamouilian et al. | |
| 6,475,336 B1 | 11/2002 | Hubacek | |
| 6,490,146 B2 | 12/2002 | Wang et al. | |
| 6,522,519 B1 | 2/2003 | Hirayanagi | |
| 6,538,872 B1 | 3/2003 | Wang et al. | |
| 6,625,003 B2 | 9/2003 | Loo et al. | |
| 6,639,783 B1 | 10/2003 | Shamouilian et al. | |
| 6,693,790 B2 | 2/2004 | Matsuki et al. | |
| 6,721,162 B2 | 4/2004 | Weldon et al. | |
| 6,723,202 B2 | 4/2004 | Nagaiwa et al. | |
| 6,754,062 B2 | 6/2004 | Logan et al. | |
| 6,839,217 B1 | 1/2005 | Larsen | |
| 6,847,014 B1 | 1/2005 | Benjamin et al. | |
| 6,922,324 B1 | 7/2005 | Horwitz | |
| 6,998,065 B1 | 2/2006 | Hasegawa et al. | |
| 7,052,553 B1 | 5/2006 | Shih et al. | |
| 7,196,295 B2 | 3/2007 | Fennewald et al. | |
| 7,431,788 B2 | 10/2008 | Ricci et al. | |
| 8,546,732 B2 | 10/2013 | Singh | |
| 8,624,168 B2 | 1/2014 | Gaff et al. | |
| 8,791,392 B2 | 7/2014 | Singh | |
| 8,952,297 B2 | 2/2015 | He et al. | |
| 9,019,684 B2 | 4/2015 | Kuribayashi | |
| 10,340,171 B2 | 7/2019 | Pape | |
| 10,910,195 B2 * | 2/2021 | Hao | H01L 21/68735 |
| 11,069,553 B2 * | 7/2021 | Matyushkin | H01L 21/6833 |
| 11,168,410 B2 * | 11/2021 | Claessens | C30B 25/12 |
| 11,223,302 B2 * | 1/2022 | Watanabe | H01L 21/68735 |
| 2001/0009497 A1 | 7/2001 | Takahasi et al. | |
| 2001/0019741 A1 | 9/2001 | Inaba et al. | |
| 2002/0036881 A1 | 3/2002 | Shamouilian et al. | |
| 2002/0050246 A1 | 5/2002 | Parkhe | |
| 2002/0073922 A1 | 6/2002 | Frankel et al. | |
| 2002/0075624 A1 | 6/2002 | Wang et al. | |
| 2002/0129901 A1 | 9/2002 | Fujikawa et al. | |
| 2003/0051665 A1 | 3/2003 | Zhao et al. | |
| 2003/0168439 A1 | 9/2003 | Kanno et al. | |
| 2003/0186545 A1 | 10/2003 | Kamp et al. | |
| 2003/0211757 A1 | 11/2003 | Gondhalekar et al. | |
| 2004/0045813 A1 | 3/2004 | Kanno et al. | |
| 2004/0060661 A1 | 4/2004 | Nishimoto et al. | |
| 2004/0134618 A1 * | 7/2004 | Endoh | H01J 37/32642 156/345.51 |
| 2004/0231798 A1 | 11/2004 | Gondhalekar et al. | |
| 2005/0016986 A1 | 1/2005 | Ito | |
| 2005/0042881 A1 | 2/2005 | Nishimoto et al. | |
| 2005/0079729 A1 | 4/2005 | Jang | |
| 2005/0105243 A1 * | 5/2005 | Lee | H01L 21/6833 361/234 |
| 2005/0145617 A1 | 7/2005 | McMillin et al. | |
| 2005/0161322 A1 * | 7/2005 | Smathers | C23C 14/3407 204/298.12 |
| 2005/0173404 A1 | 8/2005 | Benjamin et al. | |
| 2005/0211385 A1 | 9/2005 | Benjamin et al. | |
| 2005/0252903 A1 | 11/2005 | Maki et al. | |
| 2005/0253341 A1 | 11/2005 | Shojima | |
| 2006/0002053 A1 | 1/2006 | Brown et al. | |
| 2006/0096972 A1 | 5/2006 | Nakamura | |
| 2006/0273277 A1 | 12/2006 | Heller et al. | |
| 2007/0000918 A1 | 1/2007 | Steinhauser et al. | |
| 2007/0076346 A1 | 4/2007 | Dhindsa et al. | |
| 2007/0098978 A1 | 5/2007 | Tanaka et al. | |
| 2007/0131350 A1 | 6/2007 | Ricci et al. | |
| 2007/0144442 A1 | 6/2007 | Migita | |
| 2007/0267145 A1 | 11/2007 | Kitada et al. | |
| 2008/0017632 A1 | 1/2008 | Maki et al. | |
| 2008/0037194 A1 | 2/2008 | Kamitani et al. | |
| 2008/0038162 A1 | 2/2008 | Koshiishi et al. | |
| 2008/0041312 A1 | 2/2008 | Matsuyama et al. | |
| 2008/0089001 A1 | 4/2008 | Parkhe et al. | |
| 2009/0034148 A1 * | 2/2009 | Lubomirsky | H02N 13/00 361/234 |
| 2009/0101284 A1 | 4/2009 | Higuma et al. | |
| 2009/0159588 A1 * | 6/2009 | Morioka | H01L 21/67103 219/444.1 |
| 2009/0174983 A1 | 7/2009 | Dhindsa et al. | |
| 2009/0235866 A1 | 9/2009 | Kataigi et al. | |
| 2009/0283976 A1 | 11/2009 | Kaneko et al. | |
| 2010/0003824 A1 | 1/2010 | Kadkhodayan et al. | |
| 2010/0027188 A1 | 2/2010 | Liu et al. | |
| 2010/0039747 A1 | 2/2010 | Sansoni et al. | |
| 2010/0078129 A1 | 4/2010 | Himori et al. | |
| 2010/0109263 A1 | 5/2010 | Jun et al. | |
| 2010/0159712 A1 | 6/2010 | Steger | |
| 2010/0163188 A1 * | 7/2010 | Tanaka | H01L 21/68742 156/345.52 |
| 2010/0163546 A1 | 7/2010 | Nanno et al. | |
| 2010/0244350 A1 | 9/2010 | Fujisato et al. | |
| 2010/0319855 A1 | 12/2010 | Lee et al. | |
| 2011/0157760 A1 | 6/2011 | Willwerth et al. | |
| 2012/0168079 A1 * | 7/2012 | Cheng | B32B 5/26 156/324 |
| 2012/0248715 A1 | 10/2012 | Kondo et al. | |
| 2013/0001213 A1 | 1/2013 | Lee et al. | |
| 2013/0021717 A1 | 1/2013 | Singh | |
| 2013/0027838 A1 | 1/2013 | Hori et al. | |
| 2013/0114181 A1 | 5/2013 | Drewery | |
| 2013/0128397 A1 | 5/2013 | Sato | |
| 2013/0161305 A1 | 6/2013 | Ptasienski et al. | |
| 2013/0228565 A1 | 9/2013 | Kondo et al. | |
| 2013/0229746 A1 | 9/2013 | Aikawa et al. | |
| 2013/0235507 A1 | 9/2013 | Aikawa et al. | |
| 2013/0264015 A1 | 10/2013 | Fang et al. | |
| 2013/0277357 A1 | 10/2013 | Tatsumi et al. | |
| 2013/0340942 A1 | 12/2013 | Schaefer et al. | |
| 2014/0063681 A1 | 3/2014 | Anada et al. | |
| 2014/0096909 A1 | 4/2014 | Singh et al. | |
| 2014/0356985 A1 | 12/2014 | Ricci et al. | |
| 2014/0376148 A1 | 12/2014 | Sasaki et al. | |
| 2015/0024517 A1 | 1/2015 | Shriner | |
| 2015/0049410 A1 | 2/2015 | Ono | |
| 2015/0187614 A1 | 7/2015 | Gaff et al. | |
| 2015/0228513 A1 | 8/2015 | Parkhe et al. | |
| 2016/0013026 A1 | 1/2016 | Matsuura et al. | |
| 2016/0135252 A1 | 5/2016 | Matyushkin et al. | |
| 2016/0276198 A1 | 9/2016 | Anada et al. | |
| 2017/0069519 A1 * | 3/2017 | Shiraiwa | H01L 21/6831 |

(56) References Cited

U.S. PATENT DOCUMENTS

| | | | |
|---|---|---|---|
| 2018/0012785 A1 | 1/2018 | Matyushkin et al. | |
| 2018/0240688 A1 | 8/2018 | Hao et al. | |

FOREIGN PATENT DOCUMENTS

| | | | |
|---|---|---|---|
| JP | 2000-130414 A | 5/2000 | |
| JP | 2002-110774 A | 4/2002 | |
| JP | 2002299425 A | 10/2002 | |
| JP | 2003-13340 A | 1/2003 | |
| JP | 2003-133401 A | 5/2003 | |
| JP | 2004-235623 A | 8/2004 | |
| JP | 2006-86230 A | 3/2006 | |
| JP | 2007-194616 A | 8/2007 | |
| JP | 2008-42117 A | 2/2008 | |
| JP | 2008-042139 A | 2/2008 | |
| JP | 2008-243973 A | 10/2008 | |
| JP | 2009-503816 A | 1/2009 | |
| JP | 2009182092 A | 8/2009 | |
| JP | 2010-129845 A | 6/2010 | |
| JP | 2011-515015 A | 5/2011 | |
| JP | 2014-41903 A | 3/2014 | |
| JP | 2014-522103 A | 8/2014 | |
| JP | 2015-515760 A | 5/2015 | |
| JP | 2016-012733 A | 1/2016 | |
| JP | 2017-50468 A | 3/2017 | |
| KR | 10-0505035 B1 | 7/2005 | |
| KR | 20140044129 A | 4/2014 | |
| KR | 10-1413764 B1 | 7/2014 | |
| KR | 20160107415 A | 9/2016 | |
| KR | 20170028248 A | 3/2017 | |
| TW | 201351532 A | 12/2013 | |
| TW | 201545255 A | 12/2015 | |
| WO | WO-2012090782 A1 | 7/2012 | |
| WO | WO-2013039718 A1 | 3/2013 | |
| WO | WO-2015009447 A1 | 1/2015 | |

OTHER PUBLICATIONS

Notification of Transmittal of International Search Report and the Written Opinion of the International Searching Authority corresponding to International Application No. PCT/US2018/018916 dated May 23, 2018, 12 pages.

Notification of Transmittal of International Search Report and the Written Opinion of the International Searching Authority dated Jun. 20, 2018 corresponding to International Application No. PCT/US2018/021333,13 pages.

U.S. Appl. No. 15/399,244, filed Jan. 5, 2017.

U.S. Appl. No. 15/399,244, filed Jan. 5, 2017, Fangli Hao et al..

Translation of First Office Action dated Jan. 6, 2021 corresponding to Taiwanese Patent Application 106115919, 5 pages.

Translation of First Office Action dated Jun. 24, 2021 corresponding to Japanese Patent Application 2017-094326, 5 pages.

Translation of First Office Action dated Sep. 13, 2021 corresponding to Korean Patent Application 10-2017-0053480, 7 pages.

Translation of First Office Action dated Jan. 10, 2022 corresponding to Taiwanese Patent Application 110135245, 12 pages.

Translation of Notice of Allowance dated Aug. 4, 2022 corresponding to Taiwanese Patent Application 110135245, 2 pages.

Translation of Notice of Allowance dated Mar. 23, 2022 corresponding to Japanese Patent Application 2017-094326, 10 pages.

Translation of Notice of Allowance dated Apr. 25, 2022 corresponding to Korean Patent Application 10-2017-0053480, 1 page.

Translation of First Office Action dated Feb. 1, 2021 corresponding to Taiwanese Patent Application 106122460, 14 pages.

Translation of Notice of Allowance dated Sep. 14, 2021 corresponding to Taiwanese Patent Application 106122460, 2 pages.

First Office Action dated Sep. 7, 2021 corresponding to Japanese Patent Application 2017-131641, 5 pages.

Notice of Allowance dated Mar. 23, 2022 corresponding to Japanese Patent Application 2017-131641, 10 pages.

Translation of First Office Action dated Nov. 9, 2021 corresponding to Korean Patent Application 10-2017-0083390, 10 pages.

Translation of Notice of Allowance dated Jul. 22, 2022 corresponding to Korean Patent Application 10-2017-0083390, 1 pages.

Translation of First Office Action dated Nov. 10, 2021 corresponding to Japanese Patent Application 2019-536122, 6 pages.

Translation of First Office Action dated Dec. 30, 2021 corresponding to Korean Patent Application 10-2019-7022354, 15 pages.

Translation of Notice of Allowance dated Jul. 22, 2022 corresponding to Korean Patent Application 10-2019-7022354, 1 pages.

Translation of First Office Action dated Apr. 13, 2021 corresponding to Taiwanese Patent Application 107100004, 20 pages.

Translation of Second Office Action dated Nov. 17, 2021 corresponding to Taiwanese Patent Application 107100004, 7 pages.

Translation of Notice of Allowance dated Jul. 14, 2022 corresponding to Taiwanese Patent Application 107100004, 2 pages.

Translation of First Office Action dated Jul. 26, 2022 corresponding to Korean Patent Application 10-2019-7027308, 13 pages.

Translation of First Office Action dated Jul. 15, 2021 corresponding to Taiwanese Patent Application 107105728, 14 pages.

Translation of Notice of Allowance dated May 6, 2022 corresponding to Taiwanese Patent Application 107105728, 2 pages.

First Office Action dated Aug. 26, 2022 corresponding to Korean Patent Application No. 10- 2019-7029488, 5 pages.

Translation of First Office Action dated Sep. 11, 2021 corresponding to Taiwanese Patent Application 107107350, 17 pages.

Translation of Notice of Allowance dated May 17, 2022 corresponding to Taiwanese Patent Application 107107350, 2 pages.

* cited by examiner

SUBSTRATE SUPPORT WITH IMPROVED PROCESS UNIFORMITY

CROSS-REFERENCE TO RELATED APPLICATIONS

The present disclosure is a continuation of U.S. patent application Ser. No. 15/399,244, filed on Jan. 5, 2017. The entire disclosure of the application referenced above is incorporated herein by reference.

FIELD

The present disclosure relates to substrate supports in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, dielectric etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a substrate. For example, the substrate may be clamped to the ceramic layer during processing. The substrate support may include an edge ring arranged to surround an outer perimeter of ceramic layer and the substrate for optimal edge performance and yield.

SUMMARY

A substrate support for supporting a substrate in a substrate processing system includes a baseplate and a ceramic layer arranged above the baseplate. An outer perimeter of the ceramic layer is surrounded by an edge ring. An outer radius of the ceramic layer is greater than an inner radius of the edge ring such that an outer edge of the ceramic layer extends below the edge ring. In other features, the ceramic layer includes an annular groove arranged in an upper surface of the substrate and an insert arranged in the annular groove.

A substrate processing method includes providing a baseplate, arranging a ceramic layer above the baseplate, and arranging an edge ring arranged around an outer perimeter of the ceramic layer. An outer radius of the ceramic layer is greater than an inner radius of the edge ring, such that an outer edge of the ceramic layer extends below the edge ring. The ceramic layer includes an annular groove arranged in an upper surface of the substrate and an insert arranged in the annular groove. The method further includes arranging a substrate on the ceramic layer and performing at least one processing step on the substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
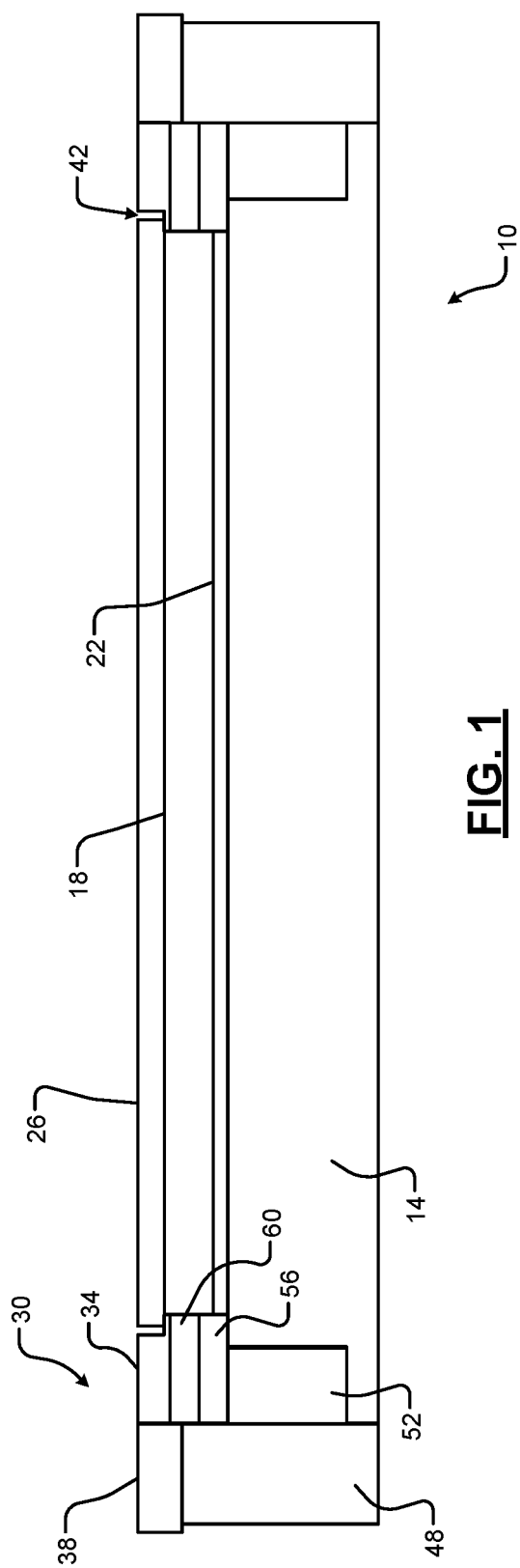
FIG. 1 is an example substrate support.

Referring now to FIG. 1, an example substrate support 10, such as an electrostatic chuck (ESC), is shown. The substrate support 10 includes a conductive baseplate 14 that supports a ceramic layer 18. A thermal resistance layer 22 (e.g., a bond layer) may be arranged between the ceramic layer 18 and the baseplate 14. A substrate 26 is arranged on the ceramic layer 18 of the substrate support 10. The substrate support 10 may include an edge assembly 30 surrounding an outer perimeter of the substrate 26. In some examples, the edge assembly 30 may include an inner edge ring 34 and an outer insulator ring 38. A gap 42 may be defined between an outer perimeter of the substrate 26 and the edge ring 34. The substrate support 10 may include one or more additional ring structures 48, 52, 56, 60 surrounding the baseplate 14 and supporting the edge ring 34. The structures 48, 52, 56, and 60 may be provided to achieve characteristics related to process uniformity, such as a desired thermal conductivity, a desired electrical or RF coupling, etc.

Manufacturing tolerances associated with the substrate 26 and/or components of the substrate support 10 may result in process non-uniformities. For example, an inner radius of the edge ring 34 may be selected to be large enough to accommodate variations in the outer radius of substrates processed on the substrate support 10. Accordingly, different substrates may have a different gap 42 between the outer radius of the substrate 26 and an inner radius of the edge ring 34. In some examples (as shown), an outer radius of the substrate 26 may overlap an inner radius of the edge ring 34, and may be greater than an outer radius of the ceramic layer 18 for desired processing performance.

Variations in the width of the gap 42 may result in non-uniformities associated with the processing of a plurality of substrates. For example, a positional relationship between an outer edge of the substrate 26 and the edge ring 34 and/or the ceramic layer 18 (e.g., distance, relative height, etc.) may cause the outer edge of the substrate 26 to be processed differently than an inner portion of the substrate 26, due to temperature non-uniformities, electric field non-uniformities, etc. As a result, the substrate 26 may have non-uniform etch depths, non-uniform amounts of deposited material, etc. at its edge. Further, the gap 42 may increase the likelihood of arcing and increase erosion of portions of the ceramic layer 26 exposed to process gases and plasma. Potential effects such as erosion and arcing may limit power applied to the substrate support, may cause increased downtime for maintenance, etc.

A substrate processing system may be configured to compensate for known process non-uniformities associated with a particular substrate support and/or processing chamber. However, compensating for these non-uniformities may be difficult when the outer radius of the substrate 26, and therefore the relationship between the substrate 26 and the edge ring 34, varies. Systems and methods according to the principles of the present disclosure implement a substrate support configured to reduce non-uniformities associated with substrate processing. For example, a ceramic layer of the substrate support has an increased diameter relative to the edge ring and substrates processed on the substrate support, and may include a replaceable (e.g., sacrificial or consumable) insert.

Figure 2:
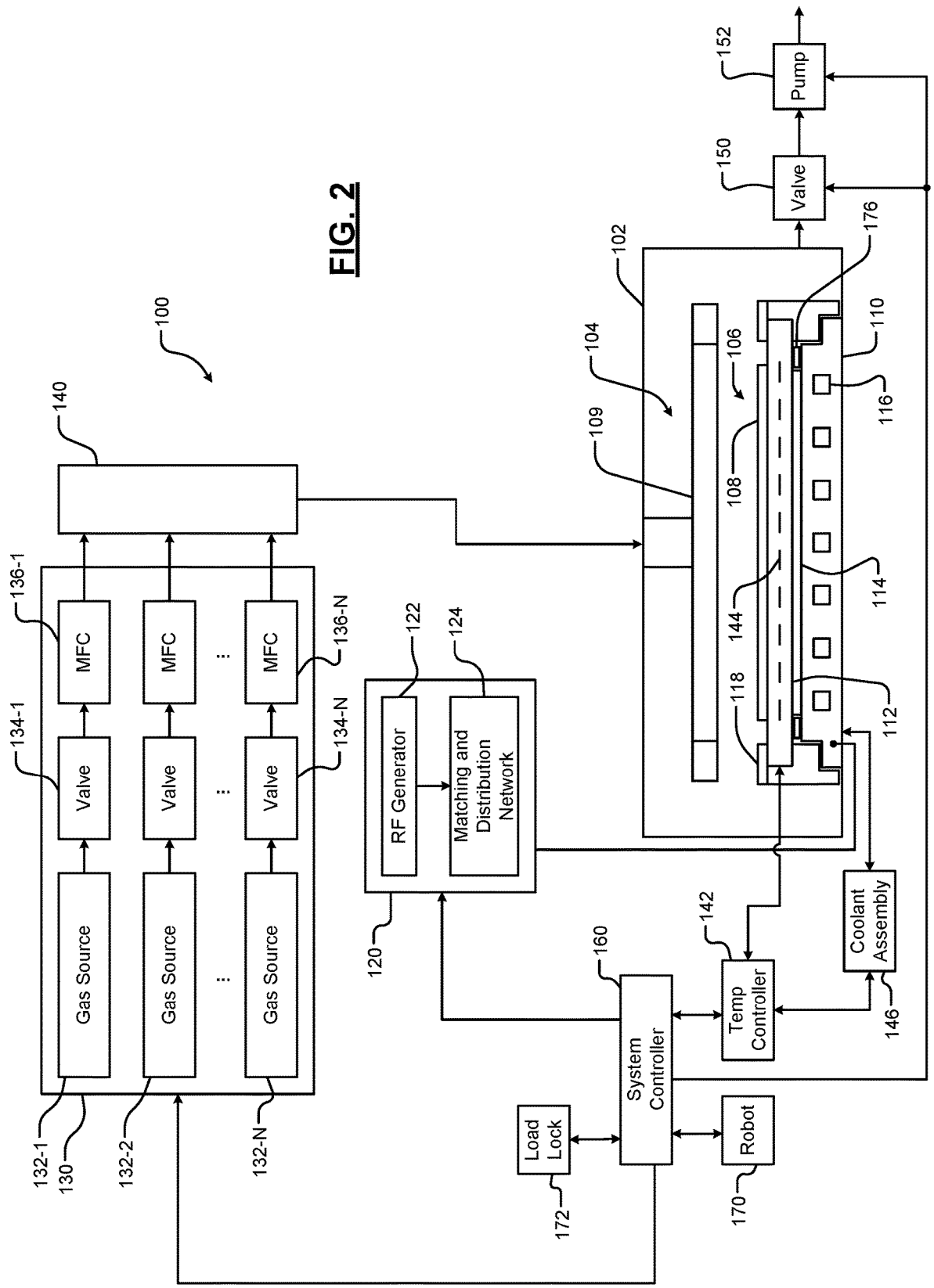
FIG. 2 is a functional block diagram of an example processing chamber according to the present disclosure.

Referring now to FIG. 2, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110. The substrate support 106 may include an edge ring 118 arranged to surround an outer perimeter of the substrate 108.

An RF generating system 120 generates and outputs an RF voltage to one of the upper electrode 104 and/or the lower electrode (e.g., the baseplate 110 of the substrate support 106). The other one of the upper electrode 104 and the baseplate 110 may be DC grounded, RF grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108. Each of the heating elements 144 according to the principles of the present disclosure may include a first material having a positive TCR and a second material having a negative TCR as described below in more detail.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The ceramic layer 112 and the edge ring 118 of the substrate support 106 according to the principles of the present disclosure have an increased outer diameter relative to the substrate 108 as described below in more detail. Further, the outer radius of the ceramic layer 112 may be greater than an inner radius of the edge ring 118 such that the ceramic layer 112 extends below the edge ring 118. The ceramic layer 112 may include a replaceable insert (not shown in FIG. 2) as described below in FIGS. 3, 4, 5, and 6.

Figure 3:
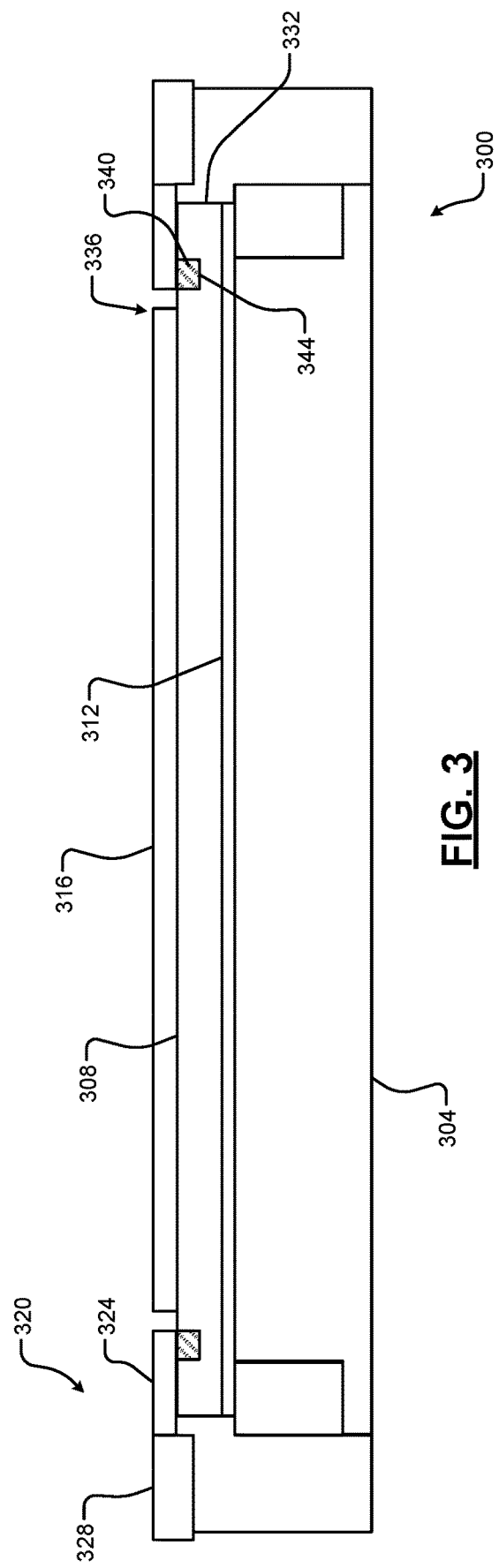
FIG. 3 is an example substrate support including a ceramic layer according to the principles of the present disclosure.
Figure 4:
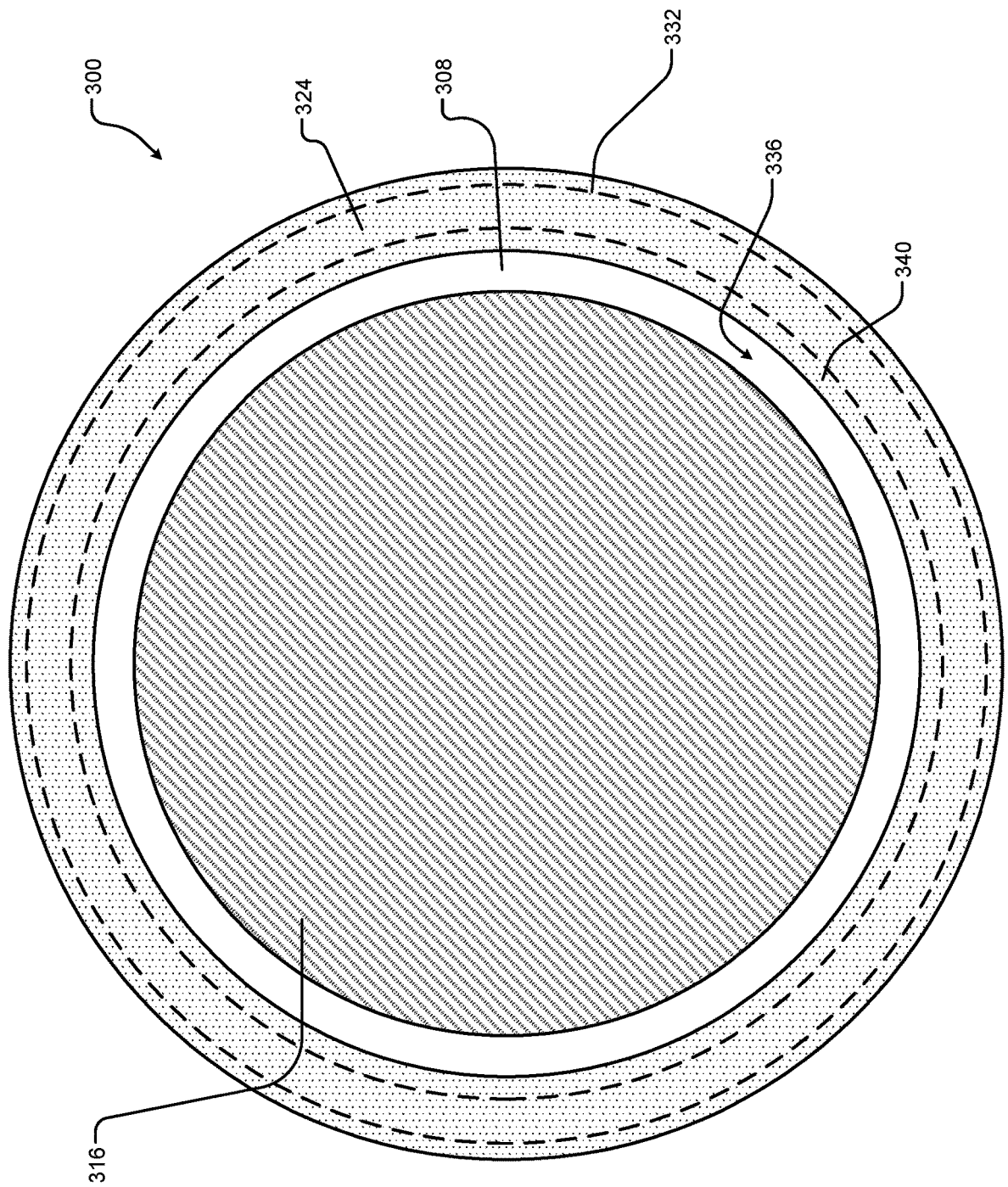
FIG. 4 is a plan view of an example substrate support including a ceramic layer according to the principles of the present disclosure.

Referring now to FIGS. 3 and 4, an example substrate support 300 is shown. The substrate support 300 is shown in a cross-section view in FIG. 3 and in a plan view in FIG. 4. The substrate support 300 includes a conductive baseplate 304 that supports a ceramic layer 308. A bond layer 312 may be arranged between the ceramic layer 308 and the baseplate 304. A substrate 316 is arranged on the ceramic layer 308. The substrate support 300 includes an edge assembly 320 arranged around an outer perimeter of the substrate 316. In some examples, the edge assembly 320 may include an inner edge ring 324 and an outer insulator ring 328. For simplicity, the outer insulator ring 328 is not shown in FIG. 4.

A diameter and outer radius (and, accordingly, an outer edge 332) of the ceramic layer 308, as well as an inner radius of the edge ring 320, are increased relative to substrates being processed on the substrate support 300. A width of a gap 336 between the substrate 316 and the edge ring 324 may be increased. For example, the outer radius of the ceramic layer 308 may be greater than an outer radius of the largest possible substrate processed on the substrate support 300 by a predetermined minimum offset. For example only, for 300 mm substrates (i.e., having a 150 mm radius), a manufacturing variance of the substrate may be as high as 1 mm, resulting in an outer radius of 150.5 mm. Accordingly, the outer radius of the ceramic layer 308 may be 150.5 mm plus the offset. In some examples, the offset is at least 1 mm. In other examples, the offset is at least 2 mm. As such, for a substrate support for processing 300 mm substrates, the outer radius of the ceramic layer 308 may be 151.5 mm to provide an offset of 1 mm. Similarly, for a substrate support for processing 450 mm substrates, the outer radius of the ceramic layer 308 may be 226.1 mm to provide an offset of 1 mm. For example only, in a configuration for processing substrates having a diameter d (e.g., d mm) and a manufacturing variance of v mm, the ceramic layer may have an outer radius greater than or equal to a sum of $(d+v)/2$ and a predetermined offset.

Although offsets of 1 mm and 2 mm have been provided for example only, the offset may have any amount sufficient to extend the ceramic layer 308 below the edge ring 324. For example, the ceramic layer 308 may have an outer radius that is a minimum amount greater than an inner radius of the edge ring 324. For example, the outer radius of the ceramic layer 308 may be 1 mm, 2 mm, 3 mm, etc. greater than an inner radius of the edge ring 324. Accordingly, the ceramic layer 308 extends below the edge ring 324, and the outer edge 332 of the ceramic layer 308 is arranged under the edge ring 324 (i.e., the edge ring 324 overlaps the outer edge 332 of the ceramic layer 308).

Because the ceramic layer 308 extends below the edge ring 324 and is larger than the substrate 316, a portion of the ceramic layer 308 is not covered by the substrate 316 or the edge ring 324. Accordingly, the ceramic layer 308 may include a replaceable insert 340. For example, the insert 340 is annular and is arranged in an annular slot or groove 344 in an upper surface of the ceramic layer 308 below the edge ring 324. For example only, the insert 340 is arranged at an interface between a portion of the ceramic layer 308 below the edge ring 324 and a portion of the ceramic layer 308 exposed to process gases and plasma (i.e., the portion of the ceramic layer 308 not covered by either the substrate 316 or the edge ring 324). This portion of the ceramic layer 308 corresponding to the insert 340 may experience increased exposure to process gases (e.g., plasma) and, therefore, increased wear and erosion. Accordingly, without the replaceable insert 340, the increased exposure to plasma caused by the gap 336 would result in increased erosion of the ceramic layer 308, and the ceramic layer 308 would require frequent replacement.

Instead, the replaceable insert 340 may be replaced at lower cost, less system downtime, and more efficient disassembly and reassembly of components of the substrate support 300. For example, the insert 340 may be replaced by removing the inner edge ring 324 of the edge assembly 320 and then removing the insert 340. For example only, the insert 340 may comprise the same material (e.g., any suitable ceramic) as the ceramic layer 308. Accordingly, exposure to process gases may cause erosion of the insert 340. As such, the insert 340 may be characterized as sacrificial or consumable.

In some examples, the substrate support 300 may eliminate and/or simplify structures such as the ring structures 48, 52, 56, and 60 as shown in FIG. 1. For example, since increasing the outer radius of the ceramic layer 308 relative to the substrate 316 improves process uniformity at an edge of the substrate 316, additional structures provided to improve process uniformity may be unnecessary. For example only, ring structures 52, 56 and 60 directly below the edge ring 34 of FIG. 1 are eliminated in the example shown in FIG. 3.

Figure 5:
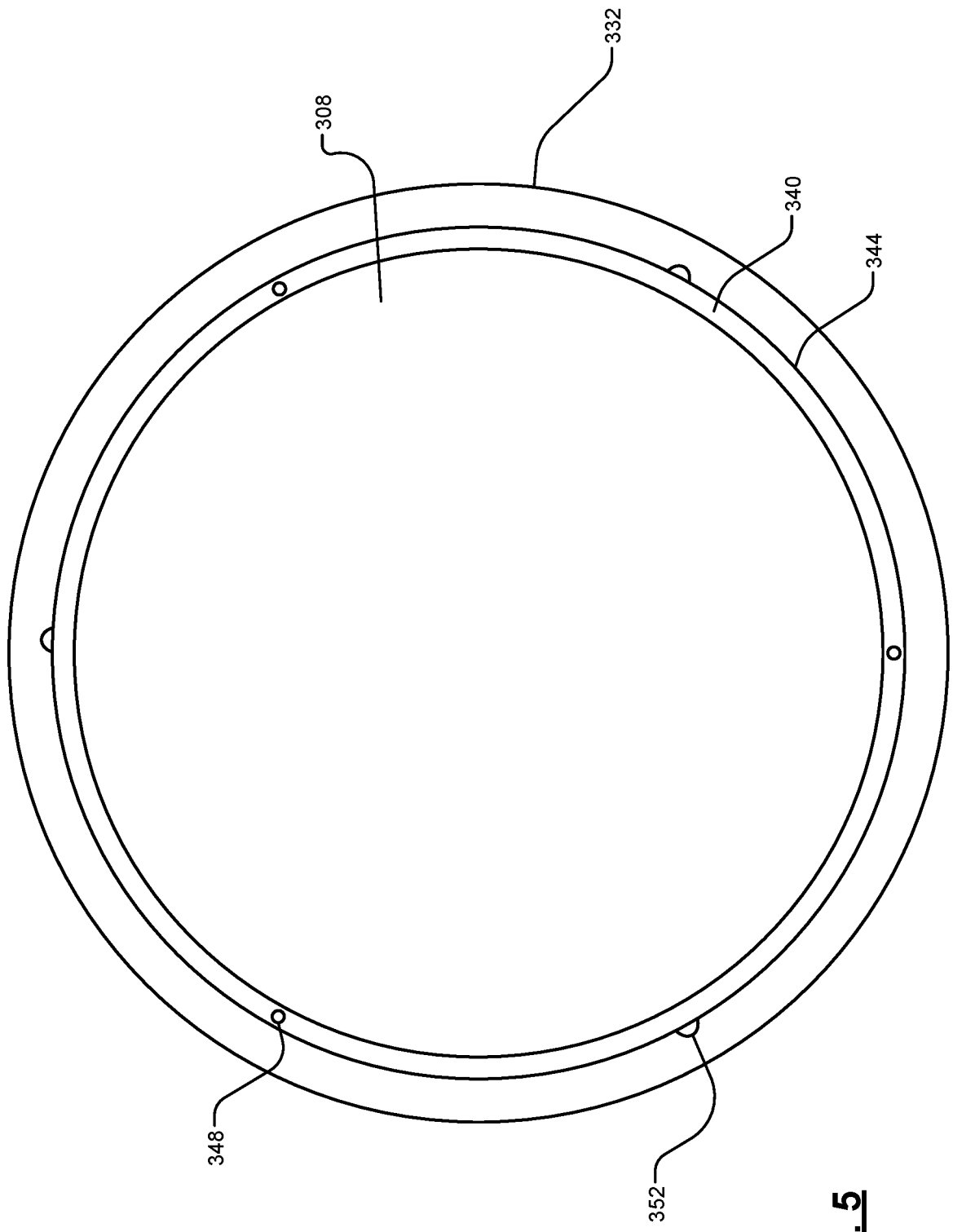
FIG. 5 is a plan view of an example ceramic layer according to the principles of the present disclosure.

Referring now to FIG. 5, an example of the ceramic layer 308 with the replaceable insert 340 is shown. In some examples, the insert 340 may include one or more tap holes (e.g., threaded tap holes) 348 for attaching the insert 340 to the ceramic layer 308. The ceramic layer 308 may include one or more cutouts 352 to facilitate removal of the insert 340 from the groove 344 in the ceramic layer 308. For example, the cutouts 352 may be configured to receive a tool for prying the insert 340 from the groove 344.

Figure 6:
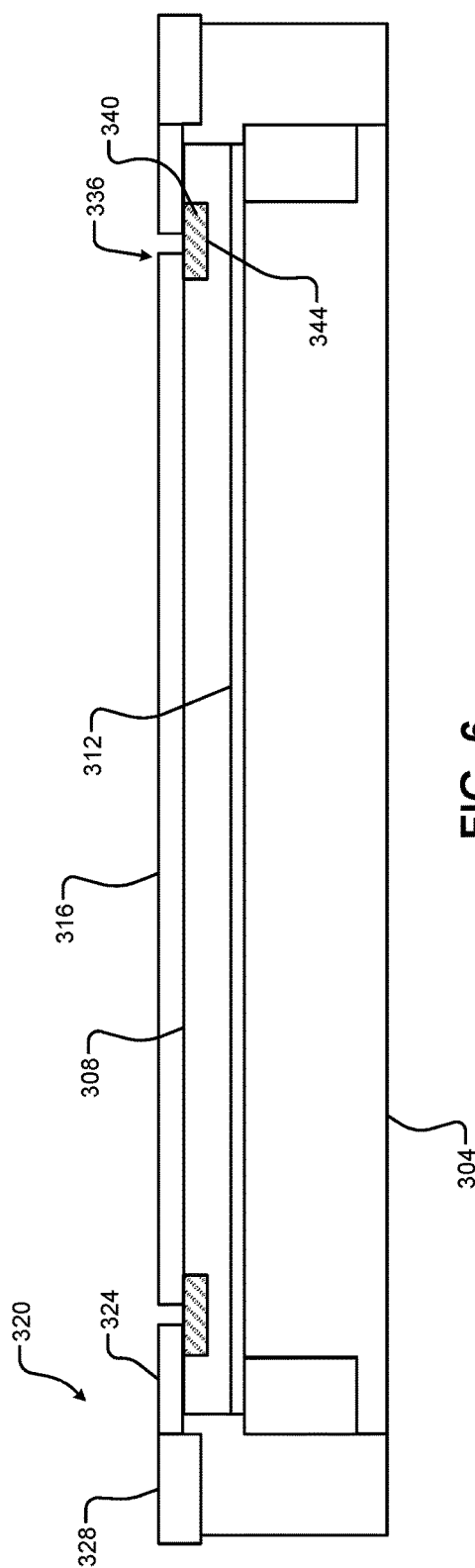
FIG. 6 is another example substrate support including a ceramic layer according to the principles of the present disclosure.

Referring now to FIG. 6, another example of the substrate support 320 is shown. In this example, the insert 340 is wider than in the example shown in FIG. 3. Accordingly, the insert 340 extends from below the edge ring 324, into the gap 336, and below an outer edge of the substrate 316. In other words, the insert 340 occupies an entire portion of the ceramic layer 308 exposed to process gases in the gap 336.

Figure 7:
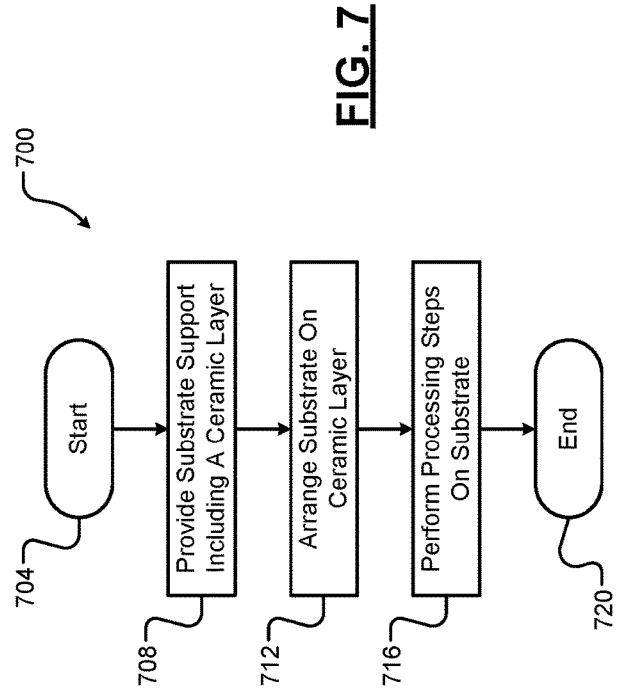
FIG. 7 illustrates steps of an example substrate processing method according to the principles of the present disclosure.

Referring now to FIG. 7, an example substrate processing method 700 begins at 704. At 708, a substrate support including a ceramic layer is provided. The substrate support is configured for processing a substrate (i.e., wafer), having a standard size, such as 200 mm, 300 mm, 450 mm, etc. The ceramic layer has an outer radius that is greater than an outer radius of substrates to be processed on the substrate support as described above. For example, if the substrate support is configured for processing standard substrates having a diameter d and a manufacturing variance of v, the ceramic layer may have an outer radius greater than or equal to a sum of $(d+v)/2$ and a predetermined offset. At 712, a substrate is arranged on the ceramic layer. At 716, one or more substrate processing steps are performed on the substrate. The method 700 ends at 720.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support for supporting a substrate in a substrate processing system, the substrate support comprising:
   a baseplate;
   a ceramic layer arranged on the baseplate, wherein the ceramic layer includes (i) an annular groove arranged in an uppermost surface of the ceramic layer and (ii) a removable insert arranged in the annular groove; and an edge ring arranged on the ceramic layer,
wherein an outer peril eter of the ceramic layer extends radially outside of an inner perimeter of the edge ring such that the outer perimeter of the uppermost surface of the ceramic layer extends below the edge ring,
wherein the insert includes one or more holes configured to facilitate attachment of the insert to the ceramic layer in the annular groove, and
wherein the insert is comprised of a same ceramic material as the ceramic layer.

2. The substrate support of claim 1, wherein the insert is positioned at least partially below the edge ring.

3. The substrate support of claim 1, wherein, when the substrate is arranged on the ceramic layer, the insert extends below the substrate.

4. The substrate support of claim 1, wherein the substrate support is configured to support a 300 mm substrate, and wherein the ceramic layer has an outer radius of at least 151.5 mm.

5. The substrate support of claim 1, wherein the substrate support is configured to support a 450 mm substrate, and wherein the ceramic layer has an outer radius of at least 226.5 mm.

6. The substrate support of claim 1, wherein the substrate support is configured to support a substrate having a diameter d mm, and wherein, when the substrate is arranged on the ceramic layer, (i) a manufacturing variance associated with the substrate is v mm, and (ii) the ceramic layer has an outer radius greater than or equal to a sum of $(d+v)/2$ and a predetermined offset.

7. The substrate support of claim 1, wherein the ceramic layer includes one or more cutouts around an outer perimeter of the insert to facilitate removal of the insert from the annular groove.

8. A substrate support for supporting a substrate in a substrate processing system, the substrate support comprising:
 a baseplate;
 a ceramic layer arranged on the baseplate;
 an annular groove arranged in an uppermost surface of the ceramic layer;
 a removable insert arranged in the annular groove; and
 a removable edge ring arranged on the ceramic layer, wherein
 an outer perimeter of the ceramic layer extends radially outside of an inner perimeter of the edge ring such that the outer perimeter of the uppermost surface of the ceramic layer extends below the edge ring, and
 wherein the insert is positioned at least partially below the edge ring, and the insert includes one or more holes configured to facilitate attachment of the insert to the ceramic layer in the annular groove, and
 wherein the insert is comprised of a same ceramic material as the ceramic layer.

9. The substrate support of claim 8, wherein, when the substrate is arranged on the ceramic layer, the insert extends below the substrate.

10. The substrate support of claim 8, wherein the substrate support is configured to support a 300 mm substrate, and wherein the ceramic layer has an outer radius of at least 151.5 mm.

11. The substrate support of claim 8, wherein the substrate support is configured to support a 450 mm substrate, and wherein the ceramic layer has an outer radius of at least 226.5 mm.

12. The substrate support of claim 8, wherein the substrate support is configured to support a substrate having a diameter d mm, and wherein, when the substrate is arranged on the ceramic layer, (i) a manufacturing variance associated with the substrate is v mm, and (ii) the ceramic layer has an outer radius greater than or equal to a sum of $(d+v)/2$ and a predetermined offset.

13. The substrate support of claim 8, wherein the ceramic layer includes one or more cutouts around an outer perimeter of the insert to facilitate removal of the insert from the annular groove.

* * * * *